(12) United States Patent
Oguz et al.

(10) Patent No.: US 10,326,075 B2
(45) Date of Patent: Jun. 18, 2019

(54) PSTTM DEVICE WITH MULTI-LAYERED FILTER STACK

(71) Applicant: Intel Corporation, Santa Clara, CA (US)

(72) Inventors: Kaan Oguz, Beaverton, OR (US); Kevin P. O'Brien, Portland, OR (US); Christopher J. Wiegand, Portland, OR (US); MD Tofizur Rahman, Portland, OR (US); Brian S. Doyle, Portland, OR (US); Mark L. Doczy, Portland, OR (US); Oleg Golonzka, Beaverton, OR (US); Tahir Ghani, Portland, OR (US); Justin S. Brockman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/755,437

(22) PCT Filed: Sep. 25, 2015

(86) PCT No.: PCT/US2015/052383
§ 371 (c)(1),
(2) Date: Feb. 26, 2018

(87) PCT Pub. No.: WO2017/052631
PCT Pub. Date: Mar. 30, 2017

(65) Prior Publication Data
US 2018/0240970 A1    Aug. 23, 2018

(51) Int. Cl.
*H01L 43/12*    (2006.01)
*H01L 43/08*    (2006.01)
(Continued)

(52) U.S. Cl.
CPC ............ *H01L 43/12* (2013.01); *G11C 11/161* (2013.01); *H01F 10/3272* (2013.01);
(Continued)

(58) Field of Classification Search
CPC ......... H01L 43/08; H01L 43/10; H01L 43/12; H01F 10/3286; H01F 10/329; G11C 11/161
See application file for complete search history.

(56) References Cited

U.S. PATENT DOCUMENTS

2004/0211963 A1    10/2004    Garni et al.
2005/0247964 A1    11/2005    Pietambaram et al.
(Continued)

FOREIGN PATENT DOCUMENTS

JP    2005044848    2/2005
JP    2008507854    3/2008
(Continued)

OTHER PUBLICATIONS

International Preliminary Report for Patentability for International Patent Application No. PCT/US15/52292, dated Apr. 5, 2018.
(Continued)

*Primary Examiner* — Mark V Prenty
(74) *Attorney, Agent, or Firm* — Green, Howard & Mughal LLP

(57) ABSTRACT

MTJ material stacks, pSTTM devices employing such stacks, and computing platforms employing such pSTTM devices. In some embodiments, perpendicular MTJ material stacks include a multi-layered filter stack disposed between a fixed magnetic layer and an antiferromagnetic layer or synthetic antiferromagnetic (SAF) stack. In some embodiments, non-magnetic layers of the filter stack include at least one of Ta, Mo, Nb, W, or Hf. These transition metals may be in pure form or alloyed with other constituents.

20 Claims, 9 Drawing Sheets

(51) Int. Cl.
*H01L 43/10* (2006.01)
*H01F 10/32* (2006.01)
*H01F 41/30* (2006.01)
*G11C 11/16* (2006.01)

(52) U.S. Cl.
CPC ....... *H01F 10/3286* (2013.01); *H01F 41/307* (2013.01); *H01L 43/08* (2013.01); *H01L 43/10* (2013.01)

(56) References Cited

U.S. PATENT DOCUMENTS

| | | |
|---|---|---|
| 2013/0001506 A1 | 1/2013 | Sato |
| 2013/0001652 A1 | 1/2013 | Yoshikawa et al. |
| 2013/0099780 A1 | 4/2013 | Ma et al. |
| 2014/0021426 A1 | 1/2014 | Lee et al. |
| 2014/0084398 A1 | 3/2014 | Oguz et al. |
| 2014/0269035 A1 | 9/2014 | Manipatruni et al. |
| 2015/0061020 A1 | 3/2015 | Yokoyama et al. |
| 2015/0171316 A1 | 6/2015 | Park et al. |
| 2018/0240970 A1* | 8/2018 | Oguz ................ H01F 10/3272 |

FOREIGN PATENT DOCUMENTS

| | | |
|---|---|---|
| JP | 2011519476 | 7/2011 |
| KR | 1020110117515 | 10/2011 |

OTHER PUBLICATIONS

International Preliminary Report on Patentability for International Patent Application No. PCT/US15/52430, dated Apr. 5, 2018.
International Preliminary Report on Patentability from PCT/US2015/052383 dated Apr. 5, 2018, 7 pgs.
International Search Report and Written Opinion for International Patent Application No. PCT/US2015/052292, dated Jun. 24, 2016.
International Search Report and Written Opinion for International Patent Application No. PCT/US2015/052383, dated Jun. 23, 2016.
International Search Report and Written Opinion for International Patent Application No. PCT/US2015/052430, dated Jun. 24, 2016.

* cited by examiner

PSTTM DEVICE WITH MULTI-LAYERED FILTER STACK

CLAIM OF PRIORITY

This Application is a National Stage Entry of, and claims priority to, PCT Application No. PCT/US2015/052383, filed on Sep. 25, 2015 and titled "PSTTM DEVICE WITH MULTI-LAYERED FILTER SACK", which is incorporated by reference in its entirety for all purposes.

CROSS-REFERENCE TO RELATED APPLICATIONS

This application contains subject matter related to PCT Application PCT/US15/52292, titled "PSTTM DEVICE WITH FREE MAGNETIC LAYERS COUPLED THROUGH A METAL LAYER HAVING HIGH TEMPERATURE STABILITY" filed on Sep. 25, 2015, and PCT Application PCT/US15/52430, titled "PSTTM DEVICE WITH BOTTOM ELECTRODE INTERFACE MATERIAL" filed on Sep. 25, 2015.

BACKGROUND

STTM devices are non-volatile memory devices that utilize a phenomenon known as tunneling magnetoresistance (TMR). For a structure including two ferromagnetic layers separated by a thin insulating tunnel layer, it is more likely that electrons will tunnel through the tunnel layer when magnetizations of the two magnetic layers are in a parallel orientation than if they are not (non-parallel or antiparallel orientation). As such, a magnetic tunneling junction (MTJ), typically comprising a fixed magnetic layer and a free magnetic layer separated by a tunneling barrier layer, can be switched between two states of electrical resistance, one state having a low resistance and one state with a high resistance. The greater the differential in resistance, the higher the TMR ratio: $(R_{AP}-R_p/R_p*100\%$ where $R_p$ and $R_{AP}$ are resistances for parallel and antiparallel alignment of the magnetizations, respectively. The higher the TMR ratio, the more readily a bit can be reliably stored in association with the MTJ resistive state. The TMR ratio of a given MTJ is therefore an important performance metric of an STTM.

For an STTM device, current-induced magnetization switching may be used to set the bit states. Polarization states of one ferromagnetic layer can be switched relative to a fixed polarization of the second ferromagnetic layer via the spin transfer torque phenomenon, enabling states of the MTJ to be set by application of current. Angular momentum (spin) of the electrons may be polarized through one or more structures and techniques (e.g., direct current, spin-hall effect, etc.). These spin-polarized electrons can transfer their spin angular momentum to the magnetization of the free layer and cause it to precess. As such, the magnetization of the free magnetic layer can be switched by a pulse of current (e.g., in about 1-10 nanoseconds) exceeding a certain critical value, while magnetization of the fixed magnetic layer remains unchanged as long as the current pulse is below some higher threshold associated with the fixed layer architecture.

For a pSTTM device, MTJs include magnetic electrodes having a perpendicular (out of plane of substrate) magnetic easy axis and can realize higher density memory than in-plane variants. Perpendicular magnetic anisotropy (PMA) can be achieved in the fixed magnetic layer through interfacial perpendicular anisotropy promoted by an adjacent layer during solid phase epitaxy.

An anti-ferromagnetic layer or a synthetic antiferromagnetic (SAF) structure within an MTJ stack can improve device performance by countering a fringing magnetic field associated with the fixed magnetic material layer. A filter or barrier material layer is typically inserted between the fixed magnetic material layer and SAF structure to decouple the crystallinity of materials employed in the SAF from that of the fixed magnetic material layer. Without a filter layer it is difficult to achieve perpendicular anisotropy in the fixed layer at high anneal temperatures. The higher TMR achieved with a filtered SAF structure has not proven robust to high temperature processing (e.g., 400° C.), with TMR often degrading to 100%, or less, as thermal treatments exceed 300° C. This loss of TMR renders such a MTJ material stack difficult to integrate with MOS transistor IC fabrication. A filter capable of improving the stability of the fixed layer that can sustain high temperature processing is therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
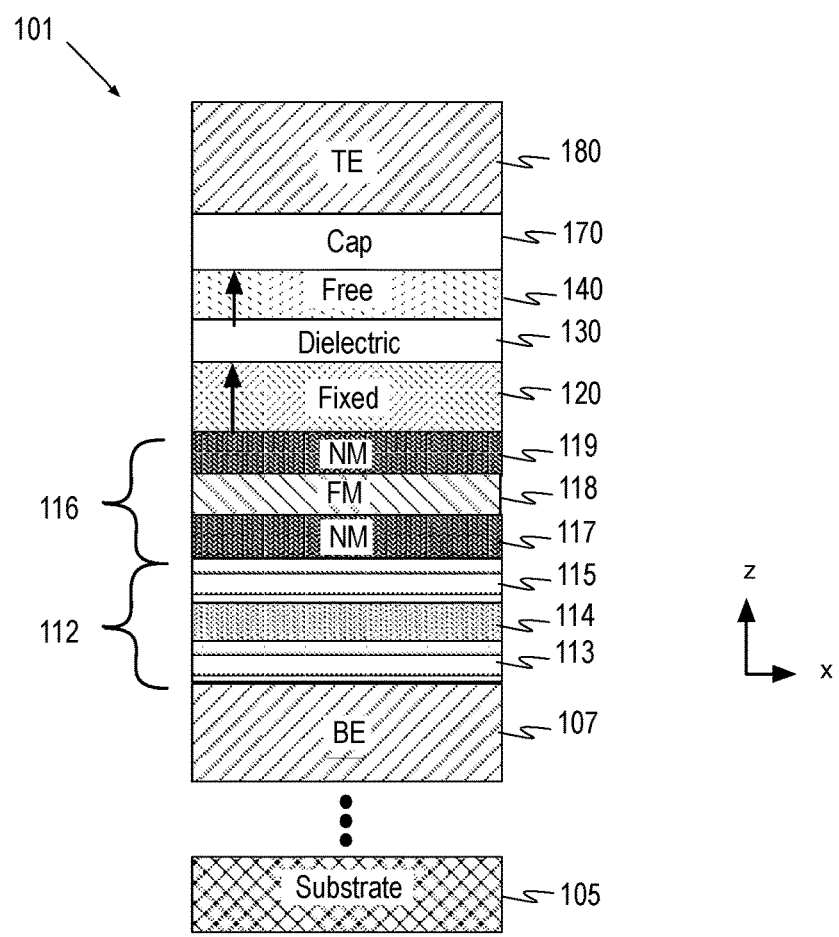
FIG. 1 is a cross-sectional view of a material layer stack for a pSTTM device including a multi-layered filter stack, in accordance with some embodiments of the present invention.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are MTJ material stacks, STTM devices employing such material stacks, and computing platforms employing such STTM devices. In some embodiments, perpendicular MTJ material stacks include fixed magnetic layers magnetically coupled to a multi-layer filter stack for improved temperature stability. Applications for embodiments described herein include embedded memory, embedded non-volatile memory (NVM), magnetic random access memory (MRAM), and non-embedded or stand-alone memories.

FIG. 1 is a cross-sectional view of a MTJ material stack 101 for a pSTTM device, in accordance with some embodiments of the present invention. MTJ material stack 101 includes a first metal electrode 107 (e.g., bottom electrode) disposed over a substrate 105. MTJ material stack 101 further includes a SAF stack 112 disposed over metal electrode 107. Although not depicted, one or more material layers may be disposed between SAF stack 112 and metal electrode 107 and/or metal electrode 107 may comprise a plurality of material layers. In some exemplary embodiments, SAF stack 112 includes a first plurality of bilayers 113 forming a superlattice of ferromagnetic material (e.g., Co, CoFe, Ni) and a nonmagnetic material (e.g., Pd, Pt, Ru). Bi-layers 113 may include n bi-layers (e.g., n [Co/Pt] bilayers, or n [CoFe/Pd] bilayers, etc.) that are separated from a second plurality of bilayers 115 (e.g., p [Co/Pt]) by an intervening non-magnetic spacer 114. Layer thicknesses within bi-layers 113 and 115 may range from 0.1-0.4 nm, for example. Spacer 114 provides the antiferromagnetic coupling between 113 and 115. Spacer 114 may be a Ruthenium (Ru) layer less than 1 nm thick, for example.

A fixed magnetic material layer or stack 120 including one or more layer of magnetic material is disposed over SAF stack 112. A tunneling dielectric material layer 130 (e.g., MgO, MgAlO) is disposed over fixed magnetic material layer or stack 120. A free magnetic material layer or stack 140 is disposed over tunneling dielectric material layer 130. Free magnetic material layer or stack 140 includes one or more free magnetic material layers. In the exemplary embodiment, a dielectric material layer 170, such as a metal oxide (e.g., MgO, VdO, TaO, HfO, WO, MoO), is disposed over free magnetic material layer/stack 140. Such a capping layer may be absent for spin-hall effect (SHE) implementations. A second metal electrode 180 (e.g., top electrode) is disposed over the capping material layer 170. Notably, the order of the material layers 107-180 may be inverted, or extending laterally away from a topographic feature sidewall, in alternative embodiments.

In some embodiments, the material stack shown in FIG. 1 is a perpendicular system, where spins of the magnetic layers are perpendicular to the plane of the material layers (i.e., the magnetic easy axis is in the z-direction out of the plane of substrate 105). Fixed magnetic layer 120 may be composed of any material or stack of materials suitable for maintaining a fixed magnetization direction while the free magnetic material stack 155 is magnetically softer (i.e. magnetization can easily rotate to parallel and antiparallel state with respect to fixed layer). In some embodiments, MTJ structure 101 is based on a CoFeB/MgO system, having an MgO tunneling material layer 130, CoFeB fixed magnetic layer/stack 120, and CoFeB free magnetic layer(s) 140. In advantageous embodiments, all CoFeB layers have (001) out-of-plane body-centered cubic (BCC) texture, where texture refers to the distribution of crystallographic orientations within in the layers of MTJ structure 101. For at least some such embodiments, a high percentage of crystals of the CoFeB/MgO/CoFeB structure 103 have the preferred (001) out-of-plane orientation (i.e., the degree of texture is high). In some CoFeB/MgO embodiments, the (001) oriented CoFeB magnetic material layers 120, and 140 are iron-rich alloys (i.e., Fe>Co) for increased magnetic perpendicularity. In some embodiments, Fe content is at least 50%. Exemplary embodiments include 20-30% B (e.g., $Co_{20}Fe_{60}B_{20}$). Other embodiments with equal parts cobalt and iron are also possible (e.g., $Co_{40}Fe_{40}B_{20}$). Other magnetic material compositions are also possible for the fixed and/or free magnetic layers, such as but not limited to: Co, Fe, Ni, and non-boron alloys of these metals (e.g., CoFe). Film thickness of fixed and free magnetic layers 120, 140 may be 0.1-2.0 nm.

Tunneling dielectric material layer 130 is composed of a material or stack of materials suitable for allowing current of a majority spin to pass through the layer, while impeding current of a minority spin (i.e., a spin filter), impacting the tunneling magnetoresistance associated with MTJ material stack 101. In some exemplary embodiments, dielectric material layer 130 is magnesium oxide (MgO). Dielectric material layer 130 may further provide a crystallization template (e.g., polycrystalline BCC with (001) texture) for solid phase epitaxy of free magnetic material layer(s) 140 and/or fixed magnetic material layer(s) 120, particularly for CoFeB/MgO/CoFeB embodiments.

Fixed magnetic material layer(s) 120 is magnetically coupled to SAF stack 112 through multi-layered filter stack 116 having high temperature (HT) tolerance. As employed herein, high temperature tolerance of the filter stack is in reference to the ability of the filter to maintain desirable fixed magnetic layer characteristics impacting temperature stability and TMR of MTJ material stack 102 through subsequent thermal treatments associated with integrated circuit device fabrication (e.g., 400° C.).

In exemplary embodiments, filter stack 116 includes at least one ferromagnetic (FM) material layer 118 disposed between a first non-magnetic (NM) material layer 117 and second NM material layer 119. FM material layer 118 may be of any ferromagnetic composition, such as but not limit to Co, Fe, Ni, and alloys of these metals. In some advantageous embodiments, FM material layer 118 is CoFeB. The CoFeB composition may be the same as that of fixed magnetic material layer(s) 120, and/or the same as that of free magnetic material layer(s) 140. In some CoFeB embodiments where both fixed magnetic layer(s) 120 and free magnetic(s) 140 are Fe-rich (Fe>Co), FM material layer 118 is also Fe-rich CoFeB, and may be 50-60% Fe. In some Fe-rich CoFeB embodiments, each of magnetic material layers 118, 120, 140 is CoFeB with 20-30% B (e.g., $Co_{20}Fe_{60}B_{20}$).

In accordance with some embodiments of multi-layered filter stack 116, at least one of NM material layers 117, 119 comprises a transition metal selected from the group consisting of Ta, Mo, Nb, W, and Hf. The transition metal may be in pure form or alloyed with other constituents. In advantageous embodiments, at least one NM material layer in filter stack 116 is predominantly (i.e., the constituent of greatest proportion in the NM material layer) one of Ta, Mo, Nb, and Hf. In some advantageous embodiments, at least one NM material layer in filter stack 116 is Ta (i.e., an NM material layer consists only of Ta).

In accordance with further embodiments, both NM material layers 117, 119 comprises a transition metal selected from the group consisting of Ta, Mo, Nb, and Hf. In accordance with some such embodiments, both NM material layers 117, 119 comprise the same transition metal selected from the group consisting of Ta, Mo, Nb, and Hf. For example, in some embodiments both NM material layers 117 and 119 consist of Ta, or comprise Ta in a Ta alloy of the same composition). In accordance with alternative embodiments, NM material layers 117, 119 comprise a different transition metal selected from the group consisting of Ta, Mo, Nb, and Hf, or comprise different alloys thereof. For example, in some embodiments a first of NM material layers 117 and 119 consists of Ta, or comprises Ta in a first Ta alloy, while a second of NM material layers 117 and 119 consists of Mo, Nb, Hf, comprises Ta in a second Ta alloy, or comprises an alloy of Mo, Nb, or Hf.

In accordance with other embodiments, only one of NM material layers 117, 119 comprises a transition metal selected from the group consisting of Ta, Mo, Nb, and Hf, while the other NM material layer is an alternate metal, such as, but not limited to W, and alloys thereof.

The thickness of the NM material layers in filter stack 116 has also been found to be important with greater thicknesses permissible for materials providing stronger magnetic coupling. In some embodiments, FM material layer 118 has a thickness less than 1 nm, and for CoFeB embodiments is advantageously 0.4-0.9 nm. In some exemplary Fe-rich 20% B embodiments (e.g., $Co_{20}Fe_{60}B_{20}$), FM material layer 118 has a thickness between 0.7 and 0.9 nm. NM material layers 117, 119 may also have thicknesses less than 1 nm, and advantageously 0.1 nm-0.5 nm. In some embodiments, thicknesses of NM material layers 117 and 119 are not equal. For example, thickness of NM material layer 119 may be thicker than NM material layer 117 by at least 0.1 nm, with each having a thickness of 0.2-0.5 nm.

Figure 2:
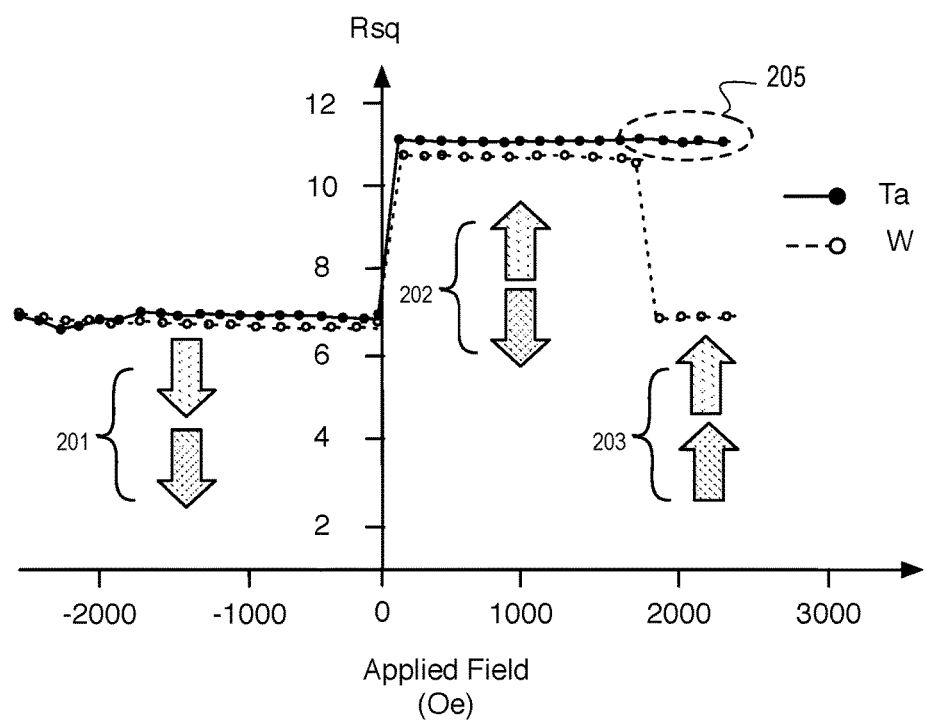
FIG. 2 is a graph of material layer stack sheet resistance as a function of applied magnetic field strength, in accordance with some embodiments.

The inventors have investigated exemplary CoFeB/MgO/CoFeB MTJ stacks and have found evidence indicating that the set of transition metals provided above may offer a significant improvement in at least temperature stability of the MTJ device relative to alternative metal, such as W. FIG. 2 is a graph of an MTJ material layer stack sheet resistance as a function of applied magnetic field strength, in accordance with some embodiments. The illustrated measurements were collected from samples having a full MTJ stack, such as that illustrated in FIG. 1. In one MTJ stack treatment, the multi-layered filter includes NM material layers consisting of W. In the other MTJ stack treatment, the multi-layered filter includes NM material layers consisting of Ta. The filter layer thicknesses are the same and all other material layers and thickness are substantially the same between the two treatments. Prior to measurement, the material stacks were annealed at a temperature of 400° C. for 30 mins to simulate subsequent HT processing. In FIG. 2, stacked arrows 201, 202, and 203 illustrate directions of magnetization in fixed and free magnetic materials associated with the visible changes in the sheet resistance ($R_{sq}$). In the case that the spin direction is up (majority) in the free magnetic layer(s), a low resistive state exists, and the directions of magnetization in the free magnetic layer(s) and the fixed magnetic layer(s) are parallel with one another. In the case that the spin direction is down (minority) in the free magnetic layer(s), a high resistive state exists and the directions of magnetization in the free magnetic layer(s) and the fixed magnetic layer(s) are anti-parallel with one another.

As shown in FIG. 2 for the MTJ stack including a W-based filter stack, a strong applied field in a first direction (e.g., −1000 Oe) induces a low resistance state associated with both fixed and free magnetic materials being magnetically oriented in a first parallel direction as represented by arrows 201. As the applied field changes direction, resistance increases to a high resistance state associated with antiparallel fixed and free magnetic orientation represented by arrows 202. The switch to anti-parallel state in the presence of the applied field illustrates the softer magnetism of the free magnetic layer. As the field further increases in strength, material stack resistance decreases back to the low resistance value when both fixed and free magnetic layers become oriented in a second parallel direction represented by arrows 203. The field strength required to switch the fixed layer in this manner is indicative of the fixed magnetic layer stability. As further shown in FIG. 2 the fixed layer in the MTJ stack including a Ta-based filter stack (e.g., both NM material layers being Ta) does not switch in the presence of the stronger applied magnetic field. In other words, constant $R_{sq}$ value over a wider applied field range 205 indicates the fixed magnetic layer for an MTJ with the Ta-based multi-layered filter is more stable than is the fixed magnetic layer for an MTJ with the W-based multi-layered filter.

Figure 3:
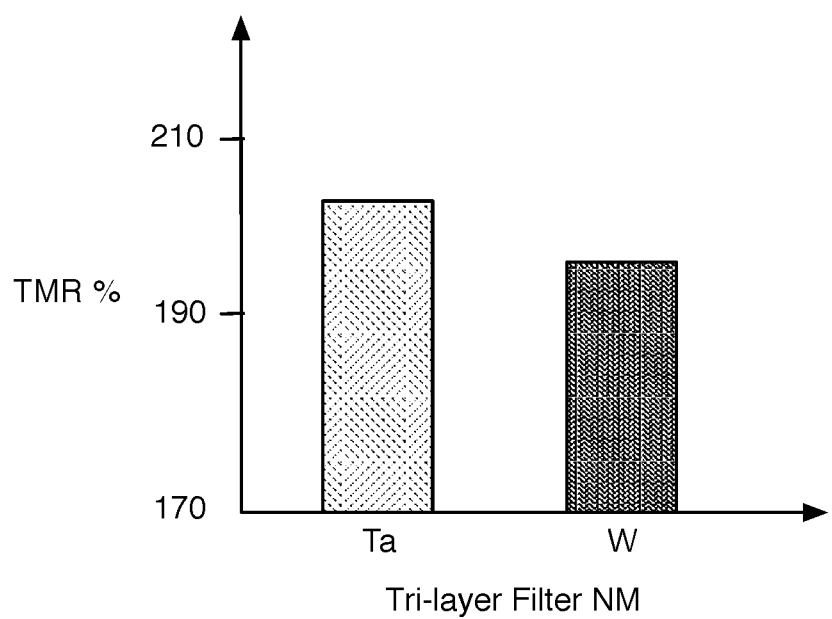
FIG. 3 is a graph comparing TMR % for material layer stacks including a multi-layer filter stack with different non-magnetic material layers, in accordance with some embodiments.

FIG. 3 is a graph comparing TMR % for MTJ material layer stacks including a multi-layer filter stack with different non-magnetic material layers, in accordance with some embodiments. The illustrated measurements were collected from samples having a full MTJ stack, such as that illustrated in FIG. 1. In one MTJ stack treatment, the multi-layered filter stack includes two NM material layers consisting of W with a CoFeB material layer disposed between the W layers. In the other MTJ stack treatment, the multi-layered filter includes two NM material layers consisting of Ta with a CoFeB material layer disposed between the Ta layers. The filter layer thicknesses are the same and all other material layers and thickness are substantially the same between the two treatments. As shown, both multi-layered filters provide a TMR of approximately 200%. As such, the Ta-based multi-layered filter provides an improvement in fixed layer stability without any TMR penalty relative to a W-based multi-layered filter.

A good NM material for a multi-layered filter is one that promotes desirable crystallinity within the magnetic layers, and therefore is at least amorphous in the as-deposited state and advantageously has a dominant stable phase with BCC crystallinity and (001) texture for CoFeB embodiments of the FM material. All of the transition metals listed above have BCC stable phases, but so too does W, and therefore additional factors may be driving the improved fixed magnetic layer stability illustrated in FIG. 2. Film composition and the attendant crystallographic and interface properties may impact, for example, magnetic coupling strength of the NM material, as well as solid phase epitaxy of the free magnetic layers. Interactions of these parameters introduce complexity in architecting a filter material stack having tolerance to high temperature processing. The NM material layers (and technique for depositing the NM material layers) may also have a significant role in the formation of magnetic dead zones during high temperature processing, particularly within a magnetic material underlayer upon which a NM material layer is deposited. Although not bound by theory, one possible explanation for the improved stability of Ta relative W illustrated in FIG. 2 is a reduction in magnetic dead zones in the (CoFeB) FM material layer 118, and/or a reduction in magnetic dead zones in the (Co/Pt) bi-layers 115. Such dead zone reductions would increase the effective thickness of the magnetic material layers. A reduction in the magnetic dead zone may be attributable to a lower atomic mixing of the underlying magnetic material. Ta has a slightly lower atomic number (Z) than W, for example, and may be deposited with lower energy. Even lighter metals, such as Mo, may advantageously reduce dead zone thickness even more relative to the W reference. Sputter deposition conditions may also vary as a function of source target material leading to a lower energy deposition of Ta. The NM material layers may also getter dopants from the magnetic layers (e.g., getter B from CoFeB) to different extent, which is currently thought to improve the crystallization of the magnetic layers. Greater effective thicknesses and/or improved crystallization of the FM material layer would improve coupling strengths between SAF stack 112 and fixed magnetic material layer 120, increasing stability. Low rates of diffusion of the NM material into the FM material may also be important for a multi-layered filter stack. Elements of higher Z tend to diffuse less rapidly, so depending also on the magnetic material, the lightest transition metals provided above (e.g., Mo) may not be as suitable as Ta even though less mixing may occur.

In further reference to FIG. 1, it is noted an MTJ stack may vary considerably above tunneling layer 130 and below SAF stack 112 without deviating from the scope of the embodiments of the present invention. For example, a free magnetic material stack including a plurality of free magnetic layers may be incorporated with the filter material stack architectures described above. In another example, an electrode interface layer may be incorporated between a SAF structure and an underlying electrode metal to further improve stability of the fixed magnetic material layer(s).

Figure 4:
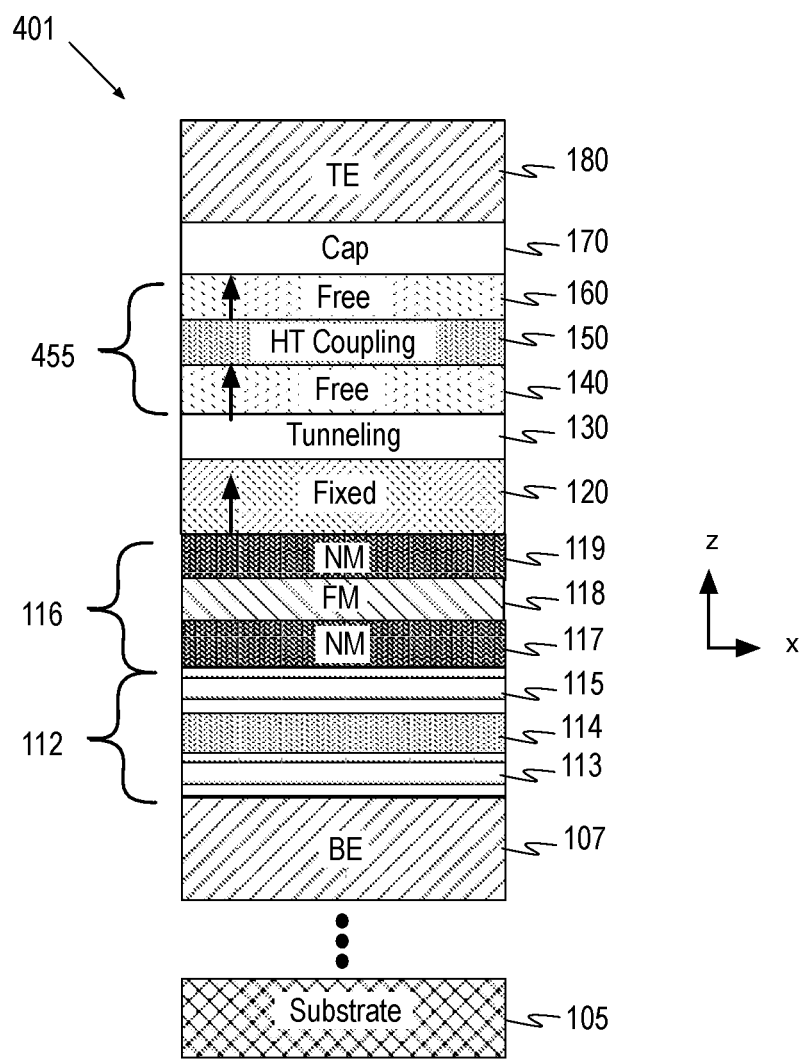
FIG. 4 is a cross-sectional view of a material layer stack for a pSTTM device further including a multi-layered magnetic material stack, in accordance with some further embodiments of the present invention.

FIG. 4 is a cross-sectional view of a material layer stack 501 for a pSTTM device further including a multi-layered free magnetic material stack 455, in accordance with some further embodiments of the present invention. Free magnetic material stack 455 includes a plurality of free magnetic material layers magnetically coupled through an intervening metal coupling material layer. In the exemplary embodiment a metal coupling material layer 150 is disposed between a first free magnetic material layer 140 and a second free magnetic material layer 160.

In some embodiments, layers of a free magnetic material stack 455 are magnetically coupled through a metal coupling layer 160 having high temperature (HT) tolerance. As employed herein, high temperature tolerance of the metal coupling layer is in reference to the ability of the coupling material to maintain desirable free magnetic layer characteristics, (e.g., high stability $\Delta$ and high anisotropy $k_{eff}$) through subsequent thermal treatments associated with integrated circuit device fabrication. Notably, a vacuum thermal anneal (e.g., ~250-300° C.) is typically performed to allow magnetic materials reach a desirable crystallinity and texture (e.g., BCC with (001) texture) from substantially amorphous as-deposited state. However, many processes conventional to MOS transistor integrated circuitry (IC) fabrication are performed at 400° C. The inventors have found that many free magnetic material stacks incorporating a coupling material layer suffer significant degradation in $K_{eff}$ as thermal treatments exceed 300° C., rendering such a MTJ material stack difficult to integrate with MOS transistor IC fabrication.

In some advantageous embodiments, layers of free magnetic material stack 455 are magnetically coupled through a coupling layer 150 comprising at least molybdenum (Mo). The Mo may be in pure form or alloyed with other constituents. In advantageous embodiments, the metal coupling material layer is at least predominantly Mo (e.g., Mo is the constituent of greatest proportion in the coupling material). In some exemplary embodiments, the coupling material is elemental Mo (i.e., no other intentional constituents). In alloyed Mo embodiments, the alloy constituents may be substantially absent from the free magnetic materials, or may also be present in the free magnetic materials. In advantageous alloyed Mo embodiments, the Mo alloy has a dominant stable BCC phase. In some exemplary embodiments Mo is alloyed one or more of Ta, W, Nb, V, Hf and Cr. The thickness of the coupling material layer has also been found to be important, advantageously being just a few angstroms to minimize damping. In some embodiments of a Mo coupling layer, the Mo film has a thickness less than 1 nm, and advantageously 0.1 and 0.8 nm.

In some embodiments, free magnetic layers 140 and 160 are both CoFeB with have body-centered cubic (BCC) (001) out-of-plane texture. For at least some CoFeB embodiments, a high percentage of CoFeB crystals have the preferred (001) out-of-plane orientation (i.e., the degree of texture is high). In some embodiments, the (001) oriented CoFeB magnetic material layers 120, 140, and 160 are iron-rich alloys (i.e., Fe>Co) for increased magnetic perpendicularity. Other magnetic material compositions are also possible for the fixed and/or free magnetic layers, such as but not limited to: Co, Fe, Ni, and non-boron alloys of these metals (e.g., CoFe). In some advantageous embodiments, film thickness of free magnetic layer 140 is 0.6-1.6 nm, while film thickness of free magnetic layer 160 is 0.1-1 nm. Free magnetic layer 140 may be thicker than free magnetic layer 160 to compensate any remaining dead region. In some embodiments however, free magnetic layers 140 and 160 have equal thickness as Mo coupling layers have been found to improve performance in a manner that suggest reduced dead layer thicknesses.

Figure 5:
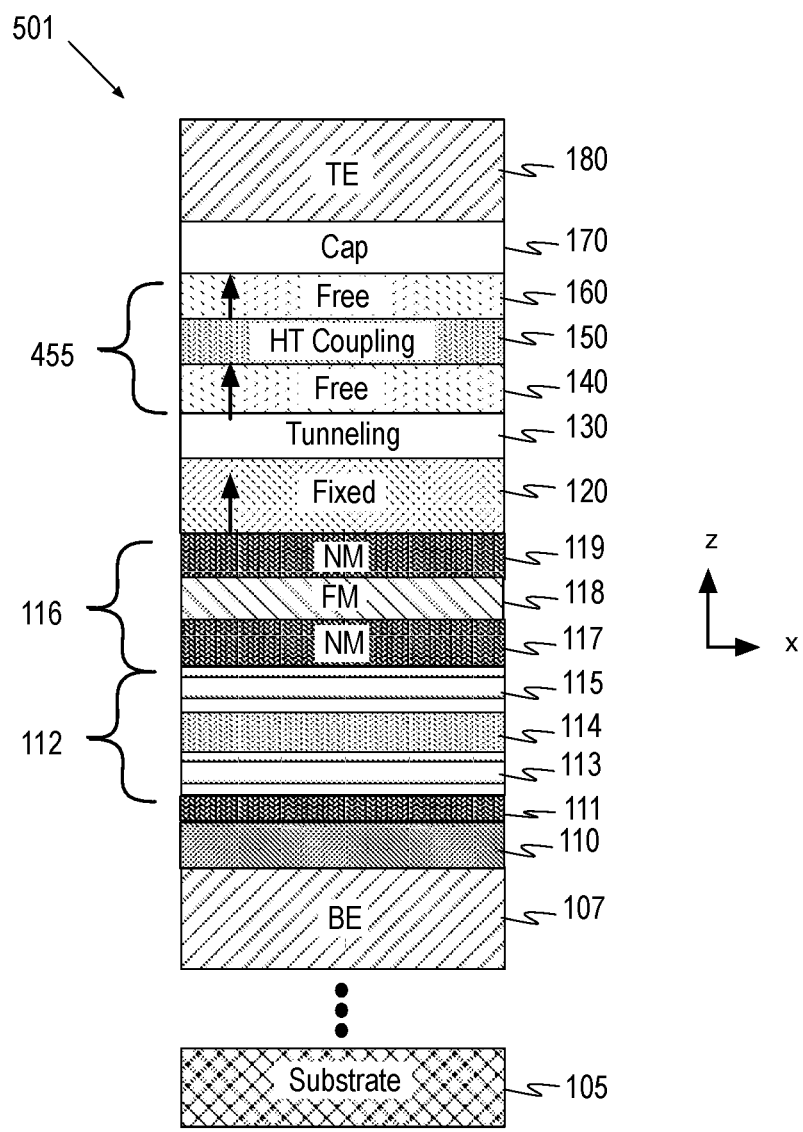
FIG. 5 is a cross-sectional view of a material layer stack for a pSTTM device further including an electrode interface material, in accordance with some further embodiments of the present invention.

FIG. 5 is a cross-sectional view of a material layer stack 502 for a pSTTM device further including an electrode interface material layer/stack 110, in accordance with some further embodiments of the present invention. In the exemplary embodiment illustrated, electrode interface material layer or stack 110 is disposed between electrode 107 and SAF stack 112. A seed layer 111 is further disposed between SAF stack 112 and interface material layer/stack 110. Seed layer 111 may be of a material having suitable composition and microstructure to promote advantageous crystallinity in SAF stack 112. In some embodiments, seed layer 111 comprises Pt and may be a substantially pure Pt (i.e. not intentionally alloyed). A seed layer of Pt is well-suited as an underlayer of a Co/Pt-based SAF structure. Electrode interface material layer or stack 110 is to promote an advantageous FCC structure with (111) texture in the seed layer. A Pt seed layer often deposits with FCC structure unless strongly templated by an underlayer. The presence of electrode interface material layer/stack 110 is to prevent seed layer from templating its crystal structure based on electrode 107, such as a surface of TiN. As such, electrode interface material layer/stack 110 may then be considered a crystal enhancing layer, enhancing the crystallinity of seed layer 111 (and SAF stack 505, etc.) relative to the crystallinity achieved when a seed layer is deposited directly on electrode 107.

In accordance with some embodiments, electrode interface material/stack 110 includes at least one material layer comprising CoFeB. For example, a single CoFeB material layer may be in direct contact with both metal electrode 107 and seed layer 111. For CoFeB electrode interface embodiments, seed layer 111 should be sufficiently thick to avoid magnetic coupling to electrode interface material/stack 110. For exemplary Pt seed layer embodiments, the Pt layer advantageously has a thickness of at least 2 nm (e.g., 2-5 nm).

A CoFeB material layer 110 may have a wide range of compositions as magnetic properties need not be optimized in the manner typical for free and/or fixed magnetic layers. In some advantageous embodiments, CoFeB material layer 110A has the same composition as that of fixed magnetic material layer(s) 120, and/or the same as that of free magnetic material layer(s) 140. CoFeB material layer 110A may have a thickness between 0.4 and 5 nm.

In accordance with some further embodiments, electrode interface material/stack 110 includes a CoFeB material layer in direct contact with seed layer 111 and a Ta material layer in direct contact with metal electrode 107. The addition of Ta material layer may improve adhesion of CoFeB material layer to metal electrode 107 (e.g., a TiN material). The Ta material layer may have a thickness of 5 nm or less (e.g., 1-5 nm), for example.

In accordance with some further embodiments, electrode interface material/stack 110 includes a Ta material layer in direct contact with seed layer 111, and a Ru material layer in direct contact with metal electrode 107. The inventors have found Ru deposited with HCP crystallinity promotes BCC crystallinity in a Ta material layer, which has further been found to favor formation of FCC crystallinity and (111) texture within the seed layer. The Ru material layer may have a thickness of 20 nm or less, and advantageously 10-20 nm.

In accordance with some further embodiments, electrode interface material/stack 110 includes a Ta material layer in direct contact with seed layer 111 and in direct contact with metal electrode 107. The inventors have found an elemental (pure) Ta can be employed without CoFeB or Ru if the Ta material layer is limited to less than 2 nm, and advantageously 1.0-1.5 nm. The inventors have found crystallinity for Ta limited to less than 1.5 nm in thickness favors formation of FCC crystallinity and (111) texture within the seed layer.

Figure 6:
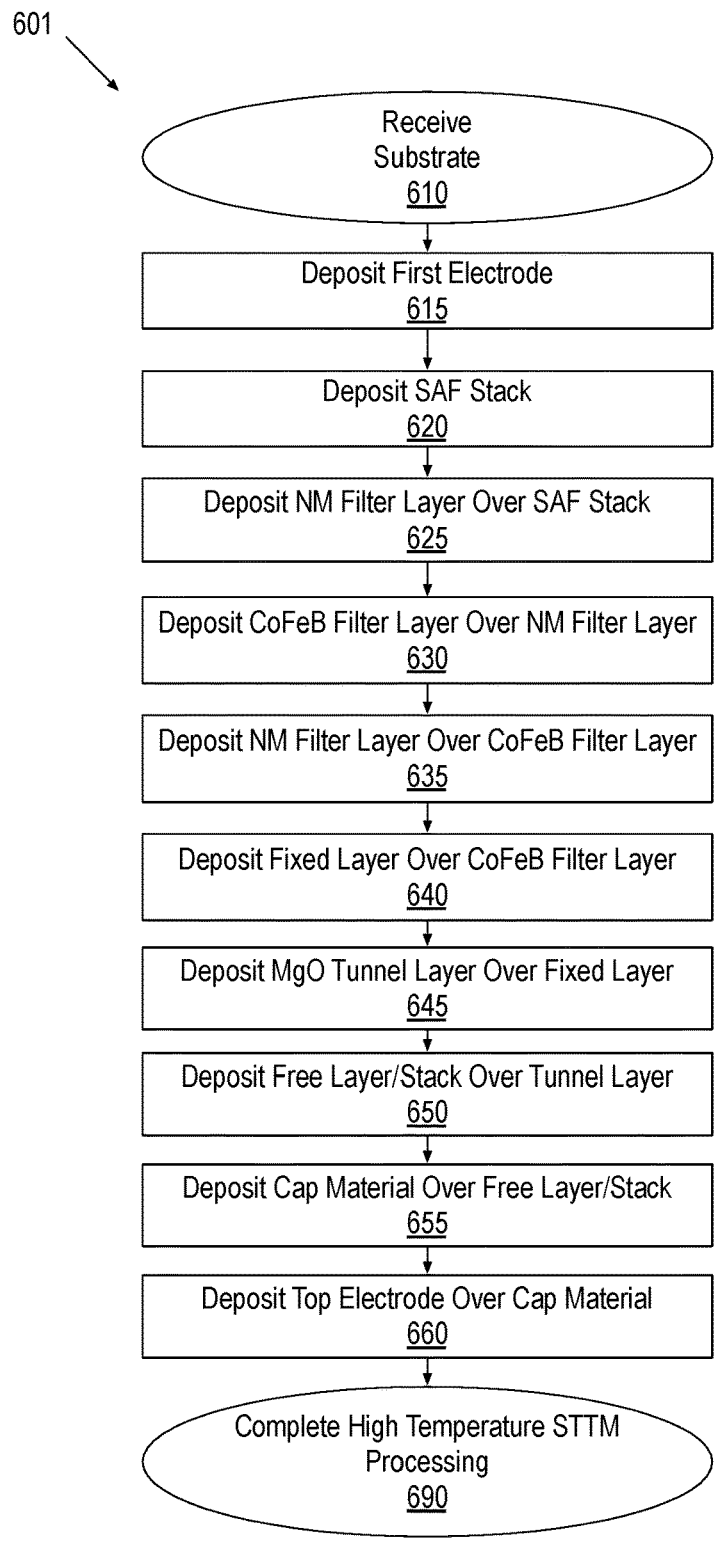
FIG. 6 is a flow diagram illustrating a method of fabricating the pSTTM device illustrated in FIG. 1, in accordance with some embodiments.

MTJ material stacks in accordance with the architectures above may be fabricated by a variety of methods applying a variety of techniques and processing chamber configurations. FIG. 6 is a flow diagram illustrating a method 601 for fabricating the STTM device illustrated in FIG. 1, in accordance with some embodiments. Method 601 begins with receiving a substrate at operation 610. Any substrate known to be suitable for microelectronic fabrication may be received, such as, but not limited to crystalline silicon substrates. Transistors and/or one or more levels of interconnect metallization may be present on the substrate as received at operation 610.

At operation 615, a first electrode metal later or stack is deposited. At operation 620, a SAF structure (or antiferromagnetic material layer) is deposited over the first electrode metal layer. At operation 625, a first Ta layer is deposited directly on a layer of the SAF structure (or antiferromagnetic material layer). At operation 630, a CoFeB layer is deposited directly on the Ta layer deposited at operation 625. At operation 635, a second Ta layer is deposited directly on the CoFeB layer deposited at operation 630. In alternative embodiments, an alloy of Ta is deposited at operations 625 and 635. In still other embodiments, at least one of Mo, Nb, or Hf, or alloys thereof is deposited at least one of operations 625 and 635. For embodiments where Ta, Mo, Nb, or Hf, or alloy thereof is deposited at only one of operations 625 and 635, another metal, such as W, may be deposited at the other operation.

Each of the filter layer materials deposited at operations 625, 630, and 635 may be deposited to within the thickness ranges described elsewhere herein. In exemplary embodiments, operations 625, 630, and 635 all entail a physical vapor deposition (sputter deposition) performed at a temperature below 250° C. One or more of co-sputtering and reactive sputtering may be utilized in any capacity known in the art to form the various layer compositions described herein. For PVD embodiments, one or more of the material layers, such as but not limited to the magnetic filter material layer, is deposited in amorphous form that may be discontinuous over a substrate area (e.g., forming islands that do not coalesce). Alternate deposition techniques, such as atomic layer deposition (ALD) may be performed for those materials having precursors known to be suitable. Alternatively, epitaxial processes such as, but not limited to, molecular beam epitaxy (MBE) may be practiced to grow one or more of the MTJ material layers. For one or more of these alternative deposition techniques, at least the magnetic material layers may be deposited with at least some microstructure (e.g., polycrystalline with texture).

At operation 640, a fixed magnetic material layer, or stack, comprising CoFeB is deposited directly on the second Ta layer. At operation 645, a tunneling dielectric material, such as MgO, is deposited over the fixed magnetic layer. At operation 650 a free magnetic material layer or stack comprising CoFeB is deposited over the tunneling dielectric material. At operation 655, a dielectric cap material, such as MgO, is deposited over the free magnetic material layer or stack. Deposition of dielectric cap material is optional, and may be omitted from the fabrication process for a spin-hall effect implementation of pSTTM, for example. At operation 660, a second electrode metal is deposited over the cap material. In exemplary embodiments, operations 640, 645, 650, 655, and 660 all entail a physical vapor deposition (sputter deposition) performed at a temperature below 250° C. One or more of co-sputtering and reactive sputtering may be utilized in any capacity known in the art to form the various layer compositions described herein. For PVD embodiments, one or more of the material layers, such as but not limited to the magnetic fixed and free material layers, are deposited in amorphous form that may be discontinuous over a substrate area (e.g., forming islands that do not coalesce). Alternate deposition techniques, such as atomic layer deposition (ALD) may be performed for those materials having precursors known to be suitable. Alternatively, epitaxial processes such as, but not limited to, molecular beam epitaxy (MBE) may be practiced to grow one or more of the MTJ material layers. For one or more of these alternative deposition techniques, at least the magnetic material layers may be deposited with at least some microstructure (e.g., polycrystalline with texture).

After one or more layers of the MTJ material stack (e.g., all layers) are deposited, an anneal is performed under any conditions known in the art, for example to promote solid phase epitaxy of amorphous CoFeB magnetic material layers imparting polycrystalline BCC structure and (001) texture. Anneal temperatures, durations, and environments may vary with exemplary embodiments performing an anneal at 250° C., or more. Method 601 is completed at operation 690 where high temperature STTM and/or MOS transistor IC processing is performed, for example at a temperature of at least 400° C. Any standard microelectronic fabrication processes such as lithography, etch, thin film deposition, planarization (e.g., CMP), and the like may be performed to complete delineation and/or interconnection of an STTM device employing any of the MTJ material stacks described herein or a subset of the material layers therein.

In an embodiment, the MTJ functions essentially as a resistor, where the resistance of an electrical path through the MTJ may exist in two resistive states, either "high" or "low," depending on the direction or orientation of magnetization in the free magnetic layer(s) and in the fixed magnetic layer(s). In the case that the spin direction is down (minority) in the free magnetic layer(s), a high resistive state exists and the directions of magnetization in the coupled free magnetic layer(s) and the fixed magnetic layer(s) are anti-parallel with one another. In the case that the spin direction is up (majority) in the free magnetic layer(s), a low resistive state exists, and the directions of magnetization in the free magnetic layer(s) and the fixed magnetic layer(s) are parallel with one another. The terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

The direction of magnetization in the coupled free magnetic layers may be switched through a process called spin transfer torque ("STT") using a spin-polarized current. An electrical current is generally non-polarized (e.g. consisting of about 50% spin-up and about 50% spin-down electrons). A spin-polarized current is one with a greater number of electrons of either spin-up or spin-down. Passing a current through the fixed magnetic layer may generate the spin-polarized current. The electrons of the spin polarized current from the fixed magnetic layer tunnel through the tunneling barrier or dielectric layer and transfers its spin angular momentum to the free magnetic layer, wherein the free magnetic layer will orient its magnetic direction from anti-parallel to that of the fixed magnetic layer or parallel. The spin-hall effect may also be employed to generate spin-polarized current through a particular electrode material that is in contact with a free magnetic material layer. For such embodiments, the free magnetic layer may be oriented without applying current through the fixed magnetic layer and other material layers of the MTJ. In either implementation, the free magnetic layer may be returned to its original orientation by reversing the current. Thus, the MTJ may store a single bit of information ("0" or "1") by its state of magnetization. The information stored in the MTJ is sensed by driving a current through the MTJ. The free magnetic layer(s) does not require power to retain its magnetic orientations. As such, the state of the MTJ is preserved when power to the device is removed. Therefore, a spin transfer torque memory bit cell composed of the material stacks described herein is non-volatile.

Figure 7:
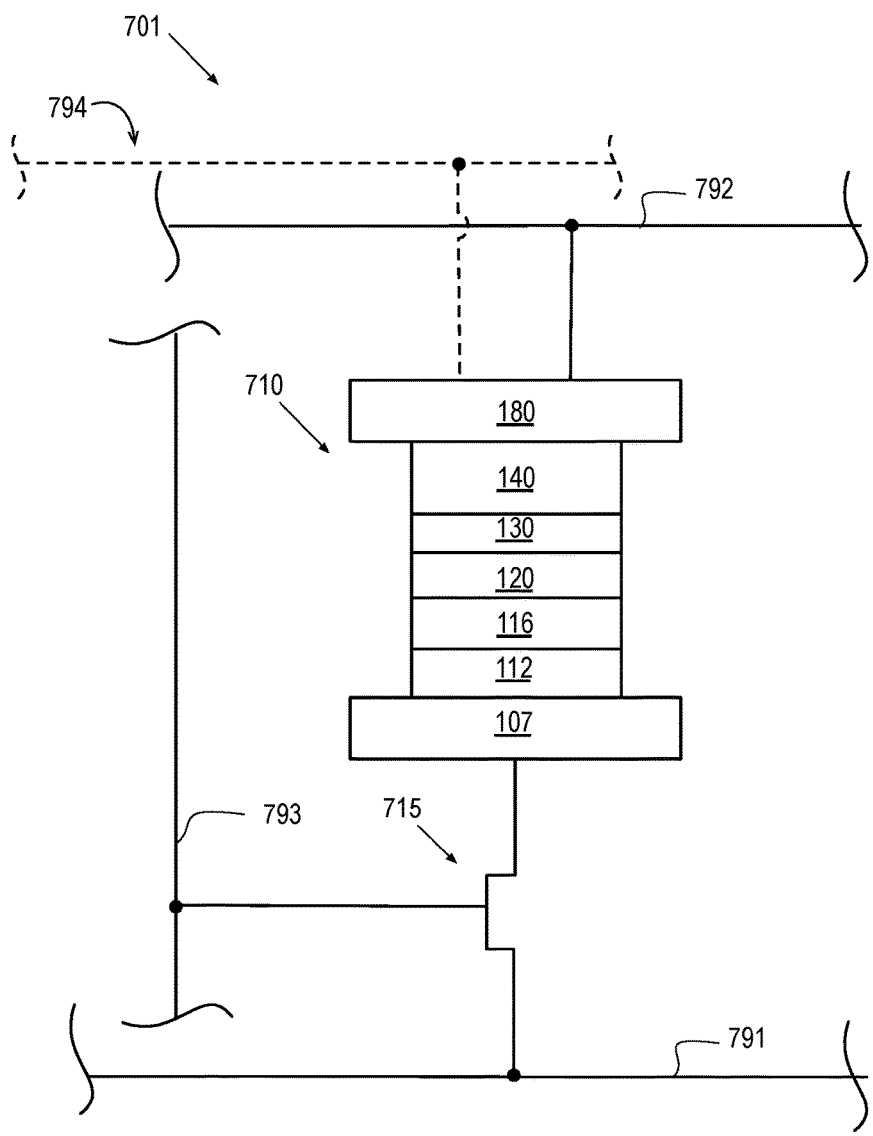
FIG. 7 is a schematic of a STTM bit cell, which includes a spin transfer torque element, in accordance with an embodiment of the present invention.

FIG. 7 is a schematic of a STTM bit cell 701, which includes a spin transfer torque element 710, in accordance with an embodiment of the present invention. The spin transfer torque element 710 includes a free magnetic material layer or stack 140 including at least one layer of magnetic material, such as CoFeB. Element 710 further includes first metallization 107 proximate to fixed magnetic layer 120 with an electrode interface material 110 and seed layer 116 disposed there between. Tunneling layer 130 is disposed between free magnetic material layer/stack 140 and fixed magnetic layer/stack 120. A second metallization 180 is proximate to free magnetic material. Second metallization 180 is electrically coupled to a first metal interconnect 792 (e.g., bit line). First metallization 107 is electrically connected to a second metal interconnect 791 (e.g., source line) through a transistor 715. The transistor 715 is further connected to a third metal interconnect 793 (e.g., word line) in any manner conventional in the art. In SHE implementations, second metallization 180 is further coupled to a fourth metal interconnect 794 (e.g., maintained at a reference potential relative to first metal interconnect 792). The spin transfer torque memory bit cell 701 may further include additional read and write circuitry (not shown), a sense amplifier (not shown), a bit line reference (not shown), and the like, as understood by those skilled in the art of solid state non-volatile memory devices. A plurality of the spin transfer torque memory bit cell 710 may be operably connected to one another to form a memory array (not shown), wherein the memory array can be incorporated into a non-volatile memory device.

Figure 8:
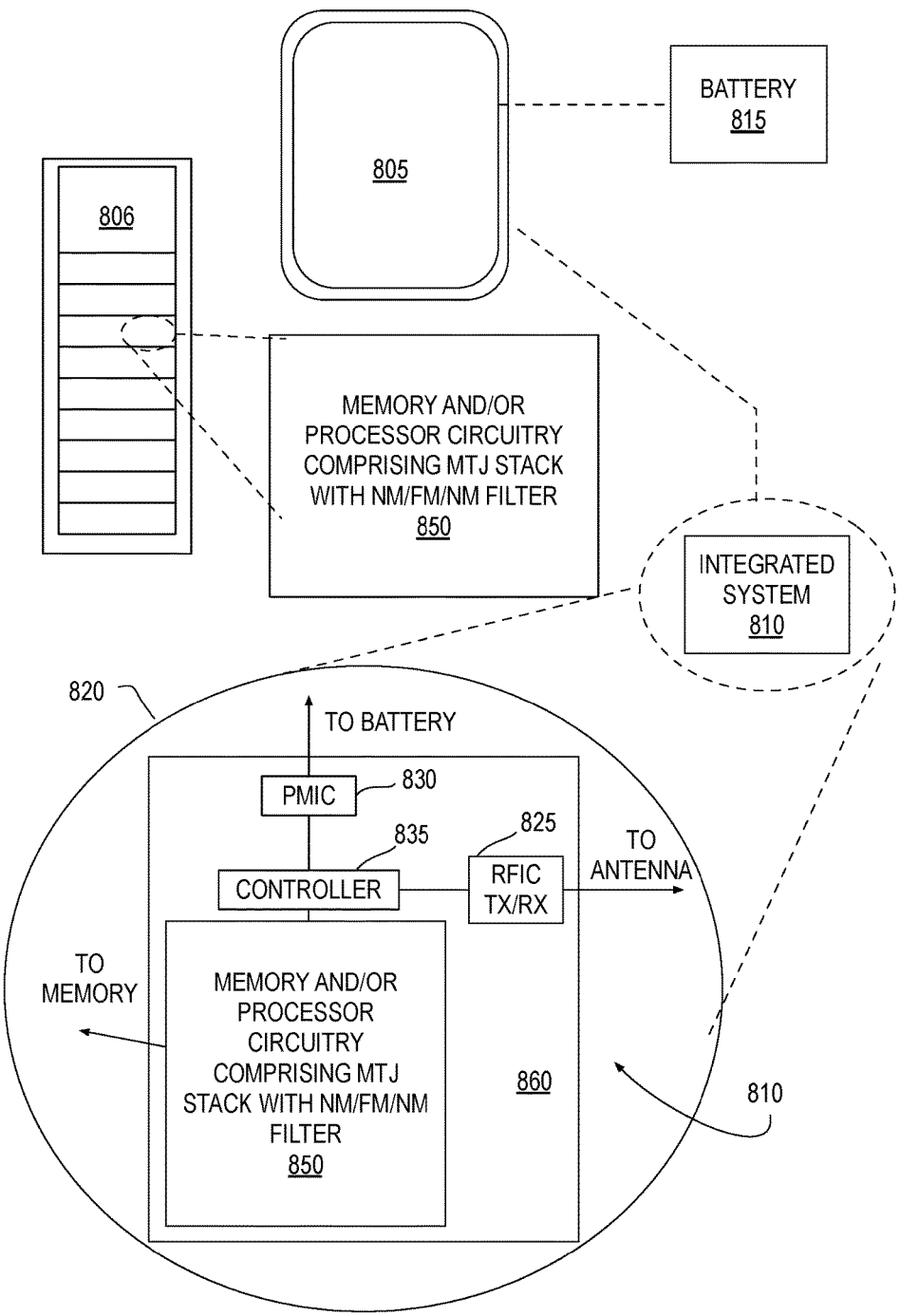
FIG. 8 is a schematic illustrating a mobile computing platform and a data server machine employing STTM arrays, in accordance with embodiments of the present invention.

FIG. 8 illustrates a system 800 in which a mobile computing platform 805 and/or a data server machine 806 employs MTJ material stacks comprising a bottom electrode interface material layer or stack, for example including CoFeB or Ta as described above. The server machine 806 may be any commercial server, for example including any number of high-performance computing platforms disposed within a rack and networked together for electronic data processing, which in the exemplary embodiment includes a packaged device 850.

The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level or package-level integrated system 810, and a battery 815.

Whether disposed within the integrated system 810 illustrated in the expanded view 820, or as a stand-alone packaged device within the server machine 806, SOC 860 includes MTJ material stacks including bottom electrode interface material layer or stack, for example including CoFeB or Ta. SOC 560 may further include a memory circuitry and/or a processor circuitry 840 (e.g., STTM, MRAM, a microprocessor, a multi-core microprocessor, graphics processor, etc.). Any of controller 835, PMIC 830, or RF (radio frequency) integrated circuitry (RFIC) 825 may include embedded STTM employing MTJ material stacks including a NM/FM/NM multi-layer filter stack, for example having at least one Ta-based material.

As further illustrated, in the exemplary embodiment, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these SoC modules may be integrated onto separate ICs coupled to a package substrate, interposer, or board.

Figure 9:
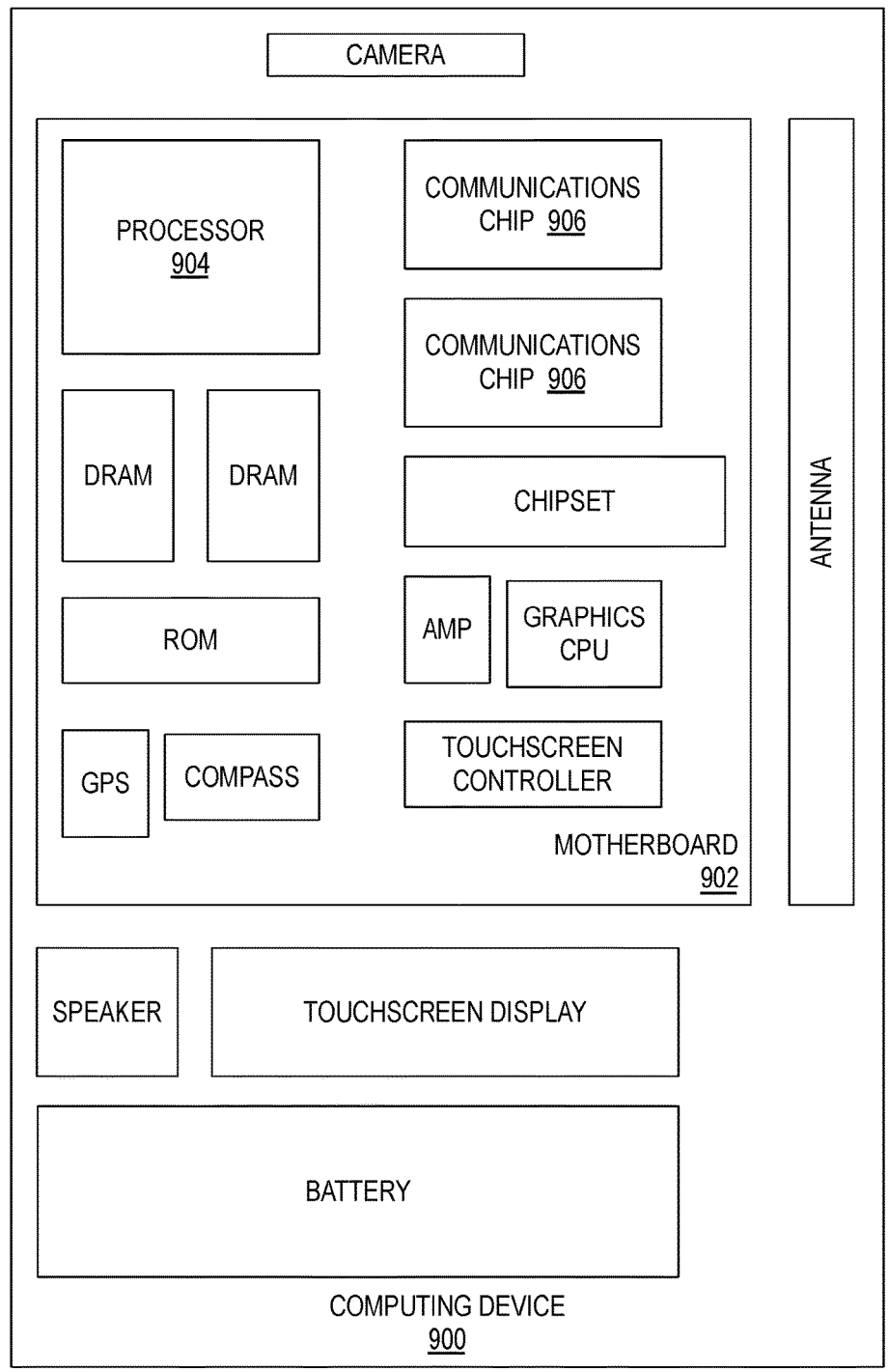
FIG. 9 is a functional block diagram illustrating an electronic computing device, in accordance with an embodiment of the present invention.

FIG. 9 is a functional block diagram of a computing device 900, arranged in accordance with at least some implementations of the present disclosure. Computing device 900 may be found inside platform 905 or server machine 906, for example. Device 900 further includes a motherboard 902 hosting a number of components, such as, but not limited to, a processor 904 (e.g., an applications processor), which may further incorporate embedded magnetic memory based on MTJ material stacks comprising a bottom electrode interface material layer or stack, for example including CoFeB or Ta as described above, in accordance with embodiments of the present invention. Processor 904 may be physically and/or electrically coupled to motherboard 902. In some examples, processor 904 includes an integrated circuit die packaged within the processor 904. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 902. In further implementations, communication chips 906 may be part of processor 904. Depending on its applications, computing device 900 may include other components that may or may not be physically and electrically coupled to motherboard 902. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including but not limited to those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments, a magnetic tunneling junction (MTJ) material layer stack disposed over a substrate includes an antiferromagnetic layer or stack, a multi-layered filter stack further comprising a first magnetic material layer disposed between two non-magnetic material layers. At least one of the non-magnetic material layers comprises at least one of Ta, Mo, Nb, or Hf. The MTJ stack further including a fixed magnetic material layer or stack comprising one or more second layers of magnetic material disposed between the filter stack and a free magnetic material layer or stack comprising one or more third layers of magnetic material. The MTJ stack further including a first layer of dielectric material disposed between the fixed magnetic material layer or stack, and the free magnetic material layer or stack.

In furtherance of the first embodiments, the magnetic material layers have perpendicular magnetic anisotropy. The antiferromagnetic layer or stack comprises a synthetic antiferromagnet (SAF) stack. A first of the non-magnetic material layers in the filter stack is in direct contact with the first magnetic material layer and a material layer of the SAF stack. A second of the non-magnetic material layers in the filter stack is in direct contact with the first magnetic material layer and one of the second layers of magnetic material.

In furtherance of the first embodiments immediately above, both of the non-magnetic material layers in the filter stack comprise Ta and each has a film thickness between 0.1 nm and 0.5 nm.

In furtherance of the first embodiments immediately above, the second of the non-magnetic material layers in the filter stack has a greater film thickness than does the first of the non-magnetic material layers.

In furtherance of the first embodiments, each of the non-magnetic material layers in the filter stack is at least predominantly Ta and has a film thickness of 0.2 nm-0.5 nm.

In furtherance of the first embodiments, each of the non-magnetic material layers in the filter stack consists of Ta.

In furtherance of the first embodiments, both of the non-magnetic material layers in the filter stack comprise at least one of Ta, Mo, Nb, W, or Hf and each has a film thickness between 0.1 nm and 0.5 nm.

In furtherance of the first embodiments immediately above, both of the non-magnetic material layers comprise Mo and each has a film thickness between 0.1 nm and 0.5 nm.

In furtherance of the first embodiments, the first, second and third magnetic material layers comprise CoFeB, the first dielectric material layer comprises MgO, and the first magnetic material layer has thickness between 0.4 and 0.9 nm.

In one or more second embodiments, a non-volatile memory cell, comprises a first electrode, a second electrode coupled to first interconnect metallization of the memory array, the MTJ material stack in any of the first embodiments, and a transistor with a first terminal electrically coupled to the first electrode, a second terminal electrically coupled to a second interconnect metallization of the memory array, and a third terminal electrically coupled to a third interconnect metallization of the memory array.

In one or more third embodiments, a non-volatile memory cell, comprises a first electrode, a second electrode coupled to first interconnect metallization of the memory array, and a MTJ material stack disposed between the first and second electrodes. The MTJ material stack further comprises an antiferromagnetic layer or stack, a multi-layered filter stack further comprising a first magnetic material layer disposed between two non-magnetic material layers, wherein at least one of the non-magnetic material layers comprises at least one of Ta, Mo, Nb, or Hf, a fixed magnetic material layer or stack comprising one or more second layers of magnetic material disposed between the filter stack and a free magnetic material layer or stack comprising one or more third layers of magnetic material, and a first layer of dielectric material disposed between the fixed magnetic material layer or stack, and the free magnetic material layer or stack. The MTJ stack further comprises a transistor with a first terminal electrically coupled to the first electrode, a second terminal electrically coupled to a second interconnect metallization of the memory array, and a third terminal electrically coupled to a third interconnect metallization of the memory array.

In furtherance of the third embodiments, the magnetic material layers have perpendicular magnetic anisotropy, the antiferromagnetic layer or stack comprises a synthetic antiferromagnet (SAF) stack, the magnetic material layers each comprise Fe-rich CoFeB, the first dielectric layer comprises MgO, each of a first and a second non-magnetic material layer in the filter stack has thickness between 0.1 and 0.5 nm, and at least one of the non-magnetic layers in the filter stack comprises a transition metal selected from the group consisting of: Ta, Mo, Nb, W, and Hf.

In furtherance of the third embodiments immediately above, the first magnetic material layer has thickness between 0.4 and 0.9 nm, and each of the non-magnetic material layers in the filter stack consists of Ta and has a film thickness of 0.2 nm-0.5 nm.

In furtherance of the third embodiments immediately above, the second of the non-magnetic material layers in the filter stack has a greater film thickness than does the first of the non-magnetic material layers.

In one or more fourth embodiment, a mobile computing platform comprises a non-volatile memory comprising a plurality of the non-volatile memory cell in any one of the third embodiments, a processor communicatively coupled to the non-volatile memory, a battery coupled to the processor, and a wireless transceiver.

In one or more fifth embodiments, a method of forming a magnetic tunneling junction (MTJ) material stack comprises depositing an antiferromagnetic layer or stack, depositing a first non-magnetic filter layer over the antiferromagnetic layer or stack, depositing a first magnetic material layer over the first non-magnetic filter layer, depositing a second non-magnetic filter layer over the magnetic material layer, depositing a fixed magnetic material layer or stack comprising one or more second layers of magnetic material over the second non-magnetic filter layer, depositing a dielectric material layer over the fixed magnetic material layer or stack, depositing a free magnetic material layer or stack comprising one or more third layers of magnetic material over the dielectric material layer, and annealing the MTJ stack at a temperature of at least 250° C., wherein at least one of the first or second non-magnetic filter layer comprises Ta, Mo, Nb, or Hf.

In furtherance of the fifth embodiments, depositing the first non-magnetic filter layer further comprises sputter depositing Ta to a thickness of 0.2 nm-0.5 nm. Depositing the second non-magnetic filter layer further comprises sputter depositing Ta to a thickness of 0.2 nm-0.5 nm.

In furtherance of the fifth embodiments immediately above, depositing the first magnetic material layer further comprises sputter depositing CoFeB directly on the first non-magnetic filter layer. Depositing the second non-magnetic filter layer further comprises sputter depositing the Ta directly on the CoFeB. Depositing the fixed magnetic material layer or stack further comprises sputter depositing CoFeB directly on the second non-magnetic filter layer.

In furtherance of the fifth embodiments, depositing the first, second and third magnetic material layers comprises sputter depositing amorphous CoFeB, and the annealing converts the amorphous CoFeB into polycrystalline BCC CoFeB with (001) texture.

In furtherance of the fifth embodiments, depositing the MTJ stack further comprises sputter depositing all of the layers at a temperature below 250° C.

In furtherance of the fifth embodiments, depositing the antiferromagnetic layer or stack further comprises depositing a first plurality of Co/Pt bi-layers, a Ru material layer over the first plurality of Co/Pt bi-layers, and a second plurality of Co/Pt bi-layers over the Ru material layer.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A magnetic tunneling junction (MTJ) material layer stack over a substrate, the stack comprising:
   an antiferromagnetic layer;
   a multi-layered filter stack further comprising a first magnetic material layer between two non-magnetic material layers, wherein at least one of the non-magnetic material layers comprises at least one of Ta, Mo, Nb, or Hf;
   a fixed magnetic material layer comprising one or more second layers of magnetic material and between the filter stack and a free magnetic material layer comprising one or more third layers of magnetic material; and
   a first layer of dielectric material between the fixed magnetic material layer and the free magnetic material layer.

2. The material stack of claim 1, wherein:
   the magnetic material layers have perpendicular magnetic anisotropy;
   the antiferromagnetic layer is one material layer of a synthetic antiferromagnet (SAF) stack;
   a first of the non-magnetic material layers in the filter stack is in direct contact with the first magnetic material layer and with a material layer of the SAF stack;
   a second of the non-magnetic material layers in the filter stack is in direct contact with the first magnetic material layer and with one of the second layers of magnetic material.

3. The material stack of claim 2, wherein both of the non-magnetic material layers in the filter stack comprise Ta and each has a film thickness between 0.1 nm and 0.5 nm.

4. The material stack of claim 3, wherein the second of the non-magnetic material layers in the filter stack has a greater film thickness than the first of the non-magnetic material layers.

5. The material stack of claim 3, wherein each of the non-magnetic material layers in the filter stack is predominantly Ta and has a film thickness of 0.2 nm-0.5 nm.

6. The material stack of claim 5, wherein each of the non-magnetic material layers in the filter stack comprises substantially pure Ta.

7. The material stack of claim 2, wherein both of the non-magnetic material layers in the filter stack comprise at least one of Ta, Mo, Nb, W, or Hf and each has a film thickness between 0.1 nm and 0.5 nm.

8. The material stack of claim 7, wherein both of the non-magnetic material layers comprise Mo and each has a film thickness between 0.1 nm and 0.5 nm.

9. The material stack of claim 1, wherein:
   the first, second and third magnetic material layers comprise CoFeB;
   the first dielectric material layer comprises an oxide of Mg; and
   the first magnetic material layer has thickness between 0.4 and 0.9 nm.

10. A non-volatile memory device, comprising:
    a first electrode;
    a second electrode coupled to first interconnect metallization of the memory array;
    a MTJ material stack between the first and second electrodes, wherein the MTJ material stack further comprises:
      an antiferromagnetic layer;
      a multi-layered filter stack further comprising a first magnetic material layer between two non-magnetic material layers, wherein at least one of the non-magnetic material layers comprises at least one of Ta, Mo, Nb, or Hf;
      a fixed magnetic material layer or stack comprising one or more second layers of magnetic material between the filter stack and a free magnetic material layer comprising one or more third layers of magnetic material; and
      a first layer of dielectric material between the fixed magnetic material layer and the free magnetic material layer; and
    a transistor with a first terminal electrically coupled to the first electrode, a second terminal electrically coupled to a second interconnect metallization of the memory array, and a third terminal electrically coupled to a third interconnect metallization of the memory array.

11. The memory device of claim 10, wherein:
    the magnetic material layers have perpendicular magnetic anisotropy;
    the antiferromagnetic layer is one material layer of a synthetic antiferromagnet (SAF) stack;
    the magnetic material layers each comprise Fe-rich CoFeB;
    the first dielectric layer comprises an oxide of Mg;
    each of a first and a second non-magnetic material layer in the filter stack has thickness between 0.1 and 0.5 nm; and
    at least one of the non-magnetic layers in the filter stack comprises at least one of Ta, Mo, Nb, W, or Hf.

12. The memory device of claim 11, wherein:
    the first magnetic material layer has thickness between 0.4 and 0.9 nm; and
    each of the non-magnetic material layers in the filter stack consists of Ta and has a film thickness of 0.2 nm-0.5 nm.

13. The memory device of claim 12, wherein the second of the non-magnetic material layers in the filter stack has a greater film thickness than does the first of the non-magnetic material layers.

14. A mobile computing platform comprising:
    a non-volatile memory comprising a plurality of the non-volatile memory cell of claim 10;

a processor communicatively coupled to the non-volatile memory;

a battery coupled to the processor; and a wireless transceiver.

15. A method of forming a magnetic tunneling junction (MTJ) material stack, comprising:

depositing an antiferromagnetic layer or stack;

depositing a first non-magnetic filter layer over the antiferromagnetic layer or stack;

depositing a first magnetic material layer over the first non-magnetic filter layer;

depositing a second non-magnetic filter layer over the magnetic material layer;

depositing a fixed magnetic material layer comprising one or more second layers of magnetic material over the second non-magnetic filter layer;

depositing a dielectric material layer over the fixed magnetic material layer;

depositing a free magnetic material layer over the dielectric material layer; and annealing the MTJ stack at a temperature of at least 250° C., wherein at least one of the first or second non-magnetic filter layer comprises at least one of Ta, Mo, Nb, or Hf.

16. The method of claim 15, wherein:

depositing the first non-magnetic filter layer further comprises sputter depositing Ta to a thickness of 0.2 nm-0.5 nm; and depositing the second non-magnetic filter layer further comprises sputter depositing Ta to a thickness of 0.2 nm-0.5 nm.

17. The method of claim 16, wherein:

depositing the first magnetic material layer further comprises sputter depositing CoFeB directly on the first non-magnetic filter layer;

depositing the second non-magnetic filter layer further comprises sputter depositing the Ta directly on the CoFeB; and depositing the fixed magnetic material layer or stack further comprises sputter depositing CoFeB directly on the second non-magnetic filter layer.

18. The method of claim 15, wherein:

depositing the first, second and third magnetic material layers comprises sputter depositing amorphous CoFeB; and the annealing converts the amorphous CoFeB into polycrystalline BCC CoFeB with (001) texture.

19. The method of claim 15, wherein depositing the MTJ stack further comprises sputter depositing all of the layers at a temperature below 250° C.

20. The method of claim 15, wherein depositing the antiferromagnetic layer further comprises depositing a first plurality of Co/Pt bi-layers, a Ru material layer over the first plurality of Co/Pt bi-layers, and a second plurality of Co/Pt bi-layers over the Ru material layer.

* * * * *